United States Patent
Jung et al.

(10) Patent No.: US 11,221,694 B2
(45) Date of Patent: Jan. 11, 2022

(54) ORGANIC LIGHT EMITTING DISPLAY APPARATUS AND METHOD OF MANUFACTURING THE SAME

(71) Applicant: Samsung Display Co., Ltd., Yongin-si (KR)

(72) Inventors: Jinwhan Jung, Yongin-si (KR); Hyeonbum Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 21 days.

(21) Appl. No.: 16/906,884

(22) Filed: Jun. 19, 2020

(65) Prior Publication Data
US 2021/0109610 A1    Apr. 15, 2021

(30) Foreign Application Priority Data
Oct. 10, 2019  (KR) .......................... 10-2019-0125683

(51) Int. Cl.
*G06F 3/041* (2006.01)
*H01L 51/52* (2006.01)
*H01L 27/32* (2006.01)
*H01L 51/56* (2006.01)

(52) U.S. Cl.
CPC ............ *G06F 3/041* (2013.01); *H01L 27/323* (2013.01); *H01L 51/5284* (2013.01); *H01L 51/56* (2013.01); *G06F 2203/04103* (2013.01); *H01L 27/3246* (2013.01); *H01L 27/3283* (2013.01); *H01L 51/5253* (2013.01)

(58) Field of Classification Search
CPC .................... G06F 3/041; G06F 2203/04103
See application file for complete search history.

(56) References Cited

U.S. PATENT DOCUMENTS

| | | | |
|---|---|---|---|
| 10,476,038 B2 | 11/2019 | Park et al. | |
| 2011/0193786 A1* | 8/2011 | Futter | G06F 3/045 345/173 |
| 2017/0185203 A1 | 6/2017 | Seong | |
| 2018/0059858 A1* | 3/2018 | Tsai | G06F 3/0412 |
| 2018/0061899 A1 | 3/2018 | Oh et al. | |
| 2018/0212051 A1* | 7/2018 | Wu | G02F 1/133305 |
| 2019/0088906 A1 | 3/2019 | Park et al. | |

FOREIGN PATENT DOCUMENTS

KR    10-2019-0033118 A    3/2019

* cited by examiner

*Primary Examiner* — Kevin M Nguyen
(74) *Attorney, Agent, or Firm* — Lewis Roca Rothgerber Christie LLP

(57) ABSTRACT

An organic light emitting display apparatus includes: a display layer including: an emission region; a first non-emission region having a pixel definition layer surrounding the emission region; and a second non-emission region having a spacer on the pixel definition layer; and a touch screen layer including a touch electrode at a position corresponding to the first non-emission region and the second non-emission region, wherein the touch screen layer further includes a sensitivity compensation layer including a first dielectric constant portion and a second dielectric constant portion of different dielectric constants arranged to respectively correspond to the first non-emission region and the second non-emission region.

18 Claims, 14 Drawing Sheets

ORGANIC LIGHT EMITTING DISPLAY APPARATUS AND METHOD OF MANUFACTURING THE SAME

CROSS-REFERENCE TO RELATED APPLICATION

The present application claims priority to and the benefit of Korean Patent Application No. 10-2019-0125683, filed on Oct. 10, 2019, in the Korean Intellectual Property Office, the disclosure of which is incorporated herein in its entirety by reference.

BACKGROUND

1. Field

Aspects of one or more example embodiments relate to an organic light emitting display apparatus and a method of manufacturing the organic light emitting display apparatus.

2. Description of Related Art

In general, an organic light emitting display apparatus may display images based on a principle in which holes and electrons respectively injected from an anode and a cathode recombine in an emission layer to emit light. Pixels in a display device have a structure including an electroluminescence (EL) device including an emission layer between a pixel electrode as an anode and an opposite electrode as a cathode.

Also, a touch screen layer for sensing touch input from users, a light blocking layer covering a region other than an emission region of the pixel to implement a black vision and the like, may be provided on a display layer where the pixels are arranged.

The above information disclosed in this Background section is only for enhancement of understanding of the background and therefore the information discussed in this Background section does not necessarily constitute prior art.

SUMMARY

Aspects of one or more example embodiments relate to an organic light emitting display apparatus and a method of manufacturing the organic light emitting display apparatus, and for example, to an organic light emitting display apparatus including an internal touch screen layer and a method of manufacturing the organic light emitting display apparatus.

However, a phenomenon may occur in which the sensitivity of a touch electrode in the touch screen layer is not uniformly formed over the entire surface of the touch screen layer and thus causing some regions to be relatively sensitive and some other regions to be relatively insensitive. For example, there may be a large sensitivity difference between a region of a spacer, which is formed in the display layer to seat a mask for depositing the emission layer, and the other regions. Such characteristics may be caused by a large difference in the interval between the touch electrode and the opposite electrode formed thereon due to the spacer protruding higher than the periphery.

In this case, the non-uniformity of touch sensitivity may lead to poor performance of the touch sensor.

Thus, one or more example embodiments include an organic light emitting display apparatus having a relatively improved touch sensitivity difference in each region due to a spacer or the like and a method of manufacturing the organic light emitting display apparatus.

Additional aspects will be set forth in part in the description which follows and, in part, will be more apparent from the description, or may be learned by practice of the presented example embodiments.

According to one or more example embodiments, an organic light emitting display apparatus includes a display layer including an emission region, a first non-emission region in which a pixel definition layer surrounding the emission region is arranged, and a second non-emission region in which a spacer is provided on the pixel definition layer, and a touch screen layer including a touch electrode arranged at a position corresponding to the first non-emission region and the second non-emission region, wherein the touch screen layer further includes a sensitivity compensation layer including a first dielectric constant portion and a second dielectric constant portion of different dielectric constants arranged to respectively correspond to the first non-emission region and the second non-emission region.

According to some example embodiments, a dielectric constant of the second dielectric constant portion may be greater than a dielectric constant of the first dielectric constant portion.

According to some example embodiments, the organic light emitting display apparatus may further include, on an opposite side of the touch screen layer with respect to a side facing the display layer, a light blocking layer including a first black matrix and a second black matrix respectively covering the first non-emission region and the second non-emission region.

According to some example embodiments, the light blocking layer may further include a transparent organic layer covering the emission region, and the transparent organic layer may also cover the first black matrix and the second black matrix.

According to some example embodiments, the light blocking layer may further include a transparent organic layer covering the emission region, and the transparent organic layer may cover the first black matrix and may not cover the second black matrix.

According to some example embodiments, the organic light emitting display apparatus may further include, between the display layer and the touch screen layer, a light blocking layer including a first black matrix and a second black matrix respectively covering the first non-emission region and the second non-emission region.

According to some example embodiments, the light blocking layer may further include a transparent organic layer covering the emission region, and the transparent organic layer may also cover the first black matrix and the second black matrix.

According to some example embodiments, the light blocking layer may further include a transparent organic layer covering the emission region, and the transparent organic layer may cover the first black matrix and may not cover the second black matrix.

According to some example embodiments, the display layer may further include an emission layer arranged in the emission region, and a pixel electrode and an opposite electrode arranged to face each other with the emission layer therebetween, and the opposite electrode may be arranged across the emission region, the first non-emission region, and the second non-emission region.

According to one or more example embodiments, a method of manufacturing an organic light emitting display apparatus includes forming a display layer including an emission region, a first non-emission region in which a pixel definition layer surrounding the emission region is arranged, and a second non-emission region in which a spacer is provided on the pixel definition layer, and forming, on the display layer, a sensitivity compensation layer including a first dielectric constant portion and a second dielectric constant portion having different dielectric constants and arranged to respectively correspond to the first non-emission region and the second non-emission region, and a touch screen layer including a touch electrode arranged at a position corresponding to the first non-emission region and the second non-emission region.

According to some example embodiments, a dielectric constant of the second dielectric constant portion may be formed to be greater than a dielectric constant of the first dielectric constant portion.

According to some example embodiments, the method may further include forming, on an opposite side of the touch screen layer with respect to a side facing the display layer, a light blocking layer including a first black matrix and a second black matrix respectively covering the first non-emission region and the second non-emission region.

According to some example embodiments, the light blocking layer may further include a transparent organic layer covering the emission region, and the transparent organic layer may be formed to also cover the first black matrix and the second black matrix.

According to some example embodiments, the light blocking layer may further include a transparent organic layer covering the emission region, and the transparent organic layer may be formed to cover the first black matrix and not to cover the second black matrix.

According to some example embodiments, the method may further include forming, between the display layer and the touch screen layer, a light blocking layer including a first black matrix and a second black matrix respectively covering the first non-emission region and the second non-emission region.

According to some example embodiments, the light blocking layer may further include a transparent organic layer covering the emission region, and the transparent organic layer may be formed to also cover the first black matrix and the second black matrix.

According to some example embodiments, the light blocking layer may further include a transparent organic layer covering the emission region, and the transparent organic layer may be formed to cover the first black matrix and not to cover the second black matrix.

According to some example embodiments, the display layer may further include an emission layer arranged in the emission region, and a pixel electrode and an opposite electrode arranged to face each other with the emission layer therebetween, and the opposite electrode may be formed to be arranged across the emission region, the first non-emission region, and the second non-emission region.

Other aspects, features, and characteristics other than those described above will become more apparent from the accompanying drawings, the appended claims, and the detailed description of the disclosure.

BRIEF DESCRIPTION OF THE DRAWINGS

The above and other aspects, features, and characteristics of certain example embodiments will be more apparent from the following description taken in conjunction with the accompanying drawings, in which.

DETAILED DESCRIPTION

Figure 1:
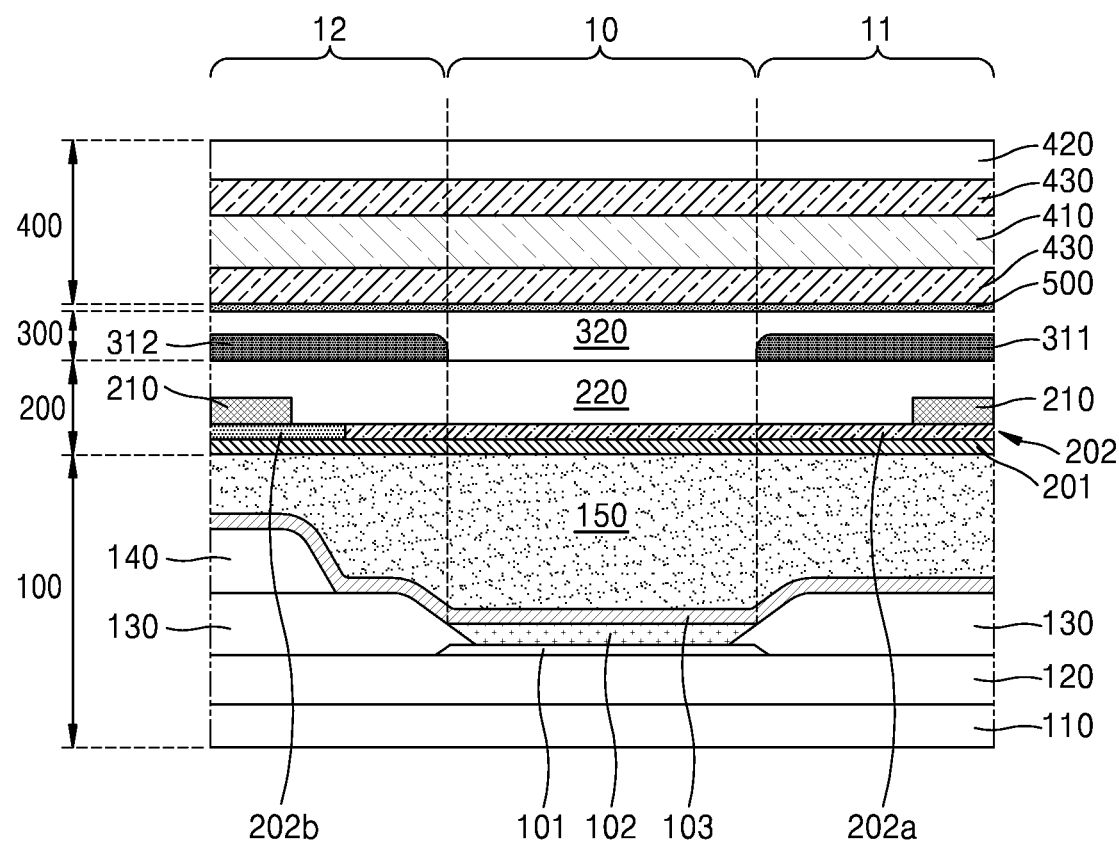
FIG. 1 is a cross-sectional view of an organic light emitting display apparatus according to some example embodiments.

Reference will now be made in more detail to aspects of some example embodiments, which are illustrated in the accompanying drawings, wherein like reference numerals refer to like elements throughout. In this regard, the present embodiments may have different forms and should not be construed as being limited to the descriptions set forth herein. Accordingly, the example embodiments are merely described below, by referring to the figures, to explain aspects of the present description. As used herein, the term "and/or" includes any and all combinations of one or more of the associated listed items. Throughout the disclosure, the expression "at least one of a, b, or c" indicates only a, only b, only c, both a and b, both a and c, both b and c, all of a, b, and c, or variations thereof.

Hereinafter, aspects of some example embodiments will be described in more detail with reference to the accompanying drawings, and in the following description, like reference numerals will denote like elements and redundant descriptions thereof will be omitted.

It will be understood that although terms such as "first" and "second" may be used herein to describe various components, these components should not be limited by these terms and these terms are only used to distinguish one component from another component.

As used herein, the singular forms "a," "an," and "the" are intended to include the plural forms as well, unless the context clearly indicates otherwise.

It will be understood that terms such as "comprise," "include," and "have" used herein specify the presence of stated features or components, but do not preclude the presence or addition of one or more other features or components.

Sizes of components in the drawings may be exaggerated for convenience of description. In other words, because the sizes and thicknesses of components in the drawings are arbitrarily illustrated for convenience of description, the present disclosure is not limited thereto.

When a certain embodiment may be implemented differently, a particular process order may be performed differently from the described order. For example, two consecutively described processes may be performed substantially at the same time or performed in an order opposite to the described order.

It will be understood that when a layer, region, or component is referred to as being "connected to" another layer, region, or component, it may be "directly connected to" the other layer, region, or component or may be "indirectly connected to" the other layer, region, or component with one or more intervening layers, regions, or components therebetween. For example, it will be understood that when a layer, region, or component is referred to as being "electrically connected to" another layer, region, or component, it may be "directly electrically connected to" the other layer, region, or component or may be "indirectly electrically connected to" the other layer, region, or component with one or more intervening layers, regions, or components therebetween.

FIG. 1 is a cross-sectional view of an organic light emitting display apparatus according to some example embodiments. Herein, only one EL device is illustrated as a reference; however, it may be considered that a plurality of EL devices are distributed in an actual product.

As illustrated, the organic light emitting display apparatus may include a display layer 100 in which an image (e.g., a static image or video images) are displayed, a touch screen layer 200 for a touch operation (e.g., for sensing touch input, for example, from a user or an external object such as a stylus), a light blocking layer 300 covering non-emission regions 11 and 12 other than an emission region 10 by black matrixes 311 and 312 to implement a black vision (or a black region), and a window layer 400 as an outermost protective layer. Also, the touch screen layer 200 may include a sensitivity compensation layer 202 including a first dielectric constant portion 202a and a second dielectric constant portion 202b, with the first dielectric constant portion 202a and the second dielectric constant portion having different dielectric constants. The function of the sensitivity compensation layer 202 will be described in more detail below.

First, as for the display layer 100, an EL device including a pixel electrode 101, an emission layer 102, and an opposite electrode 103 may be arranged on an insulating layer 120 on a substrate 110, an emission region 10 of the EL device may be surrounded by a pixel definition layer 130, and a spacer 140 may be intermittently formed on the pixel definition layer 130. Also, a thin film encapsulation layer 150 may be arranged on the EL device to cover the EL device.

The pixel definition layer 130 may partition or separate an emission region of an EL pixel, and the spacer 140 may provide support for a deposition mask when the emission layer 102 is deposited or formed.

Herein, a non-emission region including only the pixel definition layer 130 without the spacer 140 will be referred to as a first non-emission region 11, and a non-emission region including both the spacer 140 and the pixel definition layer 130 will be referred to as a second non-emission region 12.

Also, the substrate 110 may include a thin film transistor and a capacitor connected to the EL device; however, it is illustrated herein in a simplified manner for convenience.

The touch screen layer 200 provided on the display layer 100 may include an organic layer 220 as a base layer and a touch electrode 210 arranged in the organic layer 220. According to some example embodiments, the touch screen layer 200 may be formed through the same deposition process as the display layer 100, instead of being manufactured and attached as a separate component.

The light blocking layer 300 on the touch screen layer 200 may include a first black matrix 311 and a second black matrix 312 respectively covering (e.g., entirely covering or overlapping) the first non-emission region 11 and the second non-emission region 12, and a transparent organic layer 320 covering the emission region 10 as well as the first and second black matrixes 311 and 312. The first and second black matrixes 311 and 312 may cover the first and second non-emission regions 11 and 12 other than the emission region 10 to provide a clear black vision (e.g., to display a black color) when the display device is not in use, and the transparent organic layer 320 may cover the emission region 10 but may not affect light emission because the transparent organic layer 320 is a transparent material.

The window layer 400 as the outermost layer may include a polarization layer 410, a window 420, and an adhesive layer 430 attaching (e.g., mechanically coupling) the polarization layer 410 and the window 420. A moisture blocking layer 500 may be arranged to block moisture or other contaminants from penetrating into the display layer 100 and may be formed of, for example, a hydrophobic fluorinated silane-based promoter, a fluorinated acryl-based monomer, or a fluorinated alkyl-based material.

As described above, the first dielectric constant portion 202a and the second dielectric constant portion 202b of the sensitivity compensation layer 202 included in the touch screen layer 200 may have different dielectric constants. This may be a measure for correcting a difference in the influence of the first non-emission region 11 and the second non-emission region 12 on the touch screen layer 200.

That is, because only the pixel definition layer 130 is arranged in the first non-emission region 11 of the display layer 100 and both the pixel definition layer 130 and the spacer 140 are arranged in the second non-emission region 12, there may be a difference in the interval between the opposite electrode 103 and the touch electrode 210 formed thereon. Thus, because the opposite electrode 103 of the EL device is arranged not only to face the pixel electrode 101 with the emission layer 102 of the emission region therebetween but also on the pixel definition layer 130 and the spacer 140 of the first and second non-emission regions 11 and 12, the interval between the opposite electrode 103 and the touch electrode 210 may be smaller at a region including the spacer 140, which is relatively thicker, than at a region including only the pixel definition layer 130. In this case, a difference may occur in the influence of the opposite electrode 103 on the touch electrode 210 and thus a deviation may occur in the sensitivity of the touch input operation. For example, the second non-emission region 12, where the interval between the opposite electrode 103 and the touch electrode 210 is relatively small, may have a lower sensitivity than the first non-emission region 11, where the interval between the opposite electrode 103 and the touch electrode 210 is relatively large, for example, due to the influence of the parasitic capacitance between the opposite electrode 103 and the touch electrode 210.

Thus, according to some example embodiments of the present embodiment, the first dielectric constant portion 202a and the second dielectric constant portion 202b of the sensitivity compensation layer 202 in the touch screen layer 200 may be formed to have different dielectric constants, which may reduce or prevent differences in sensitivity of touch input operations at different regions.

Figure 7:
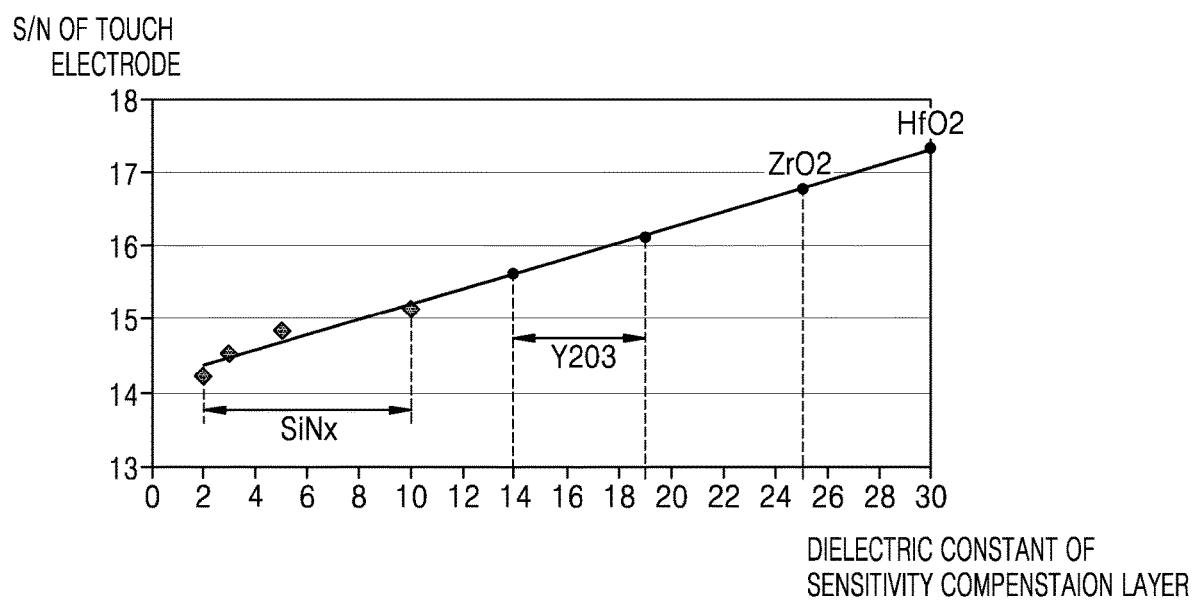
FIG. 7 is a graph illustrating the correlation between the dielectric constant of a sensitivity compensation layer and the S/N of a touch electrode.

As illustrated in the graph of FIG. 7, the sensitivity of the touch electrode 210 may improve as the dielectric constant of the sensitivity compensation layer 202 increases. Here, S/N denotes a signal-to-noise ratio of the touch electrode 210.

Thus, according to some example embodiments, the dielectric constant of the second dielectric constant portion 202b of the second non-emission region 12 having a relatively low touch sensitivity may be set to be higher than the dielectric constant of the first dielectric constant portion 202a of the first non-emission region 11.

In this way, the touch sensitivity difference caused by the spacer 140 may be compensated for by the sensitivity difference due to the dielectric constants of the first and second dielectric constant portions 202a and 202b, and thus, the touch sensitivity of the first and second non-emission regions 11 and 12 may be corrected to be uniform.

As such, the dielectric constants of the first and second dielectric constant portions 202a and 202b of the sensitivity compensation layer 202 may be set to be different from each other to correct the touch sensitivity difference between the first non-emission region 11 and the second non-emission region 12 to be uniform, thus ensuring a relatively stable touch operation.

A reference numeral "201" denotes a buffer layer of a $SiN_x$ material as a base layer of the touch screen layer 200.

As such, the organic light emitting display apparatus including the sensitivity compensation layer 202 in the touch screen layer 200 may be manufactured as illustrated in FIGS. 2A to 2D.

Figure 2A:
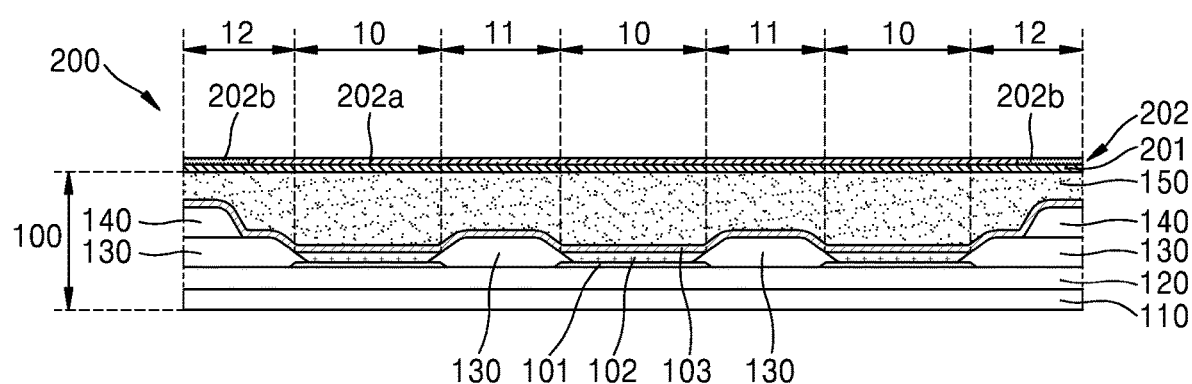
FIGS. 2A to 2D are cross-sectional views sequentially illustrating a process of manufacturing the organic light emitting display apparatus illustrated in FIG. 1.

First, as illustrated in FIG. 2A, a buffer layer 201 and a sensitivity compensation layer 202 may be formed on a display layer 100. In this case, a first dielectric constant portion 202a and a second dielectric constant portion 202b may be formed in the same layer, and for example, the first dielectric constant portion 202a may be formed of a $SiN_x$ material and the second dielectric constant portion 202b may be formed of a material such as $Y_2O_3$, $ZrO_2$, or $HfO_2$ having a higher dielectric constant than the $SiN_x$ material (see FIG. 7). The first dielectric constant portion 202a may be arranged to correspond to an emission region 10 and a first non-emission region 11, and the second dielectric constant portion 202b may be arranged to correspond to a second non-emission region 12. For example, the second dielectric constant portion 202b may be arranged to correspond to the position of a spacer 140. The second dielectric constant portion 202b may be formed of a $ZrO_2$ material, and the first dielectric constant portion 202a may be formed of a $Y_2O_3$ material having a lower dielectric constant than the $ZrO_2$ material. Any suitable material may be used as long as it satisfies the relationship of the dielectric constant of the first dielectric constant portion 202a being different from (e.g., less than) the dielectric constant of the second dielectric constant portion 202b.

Figure 2B:
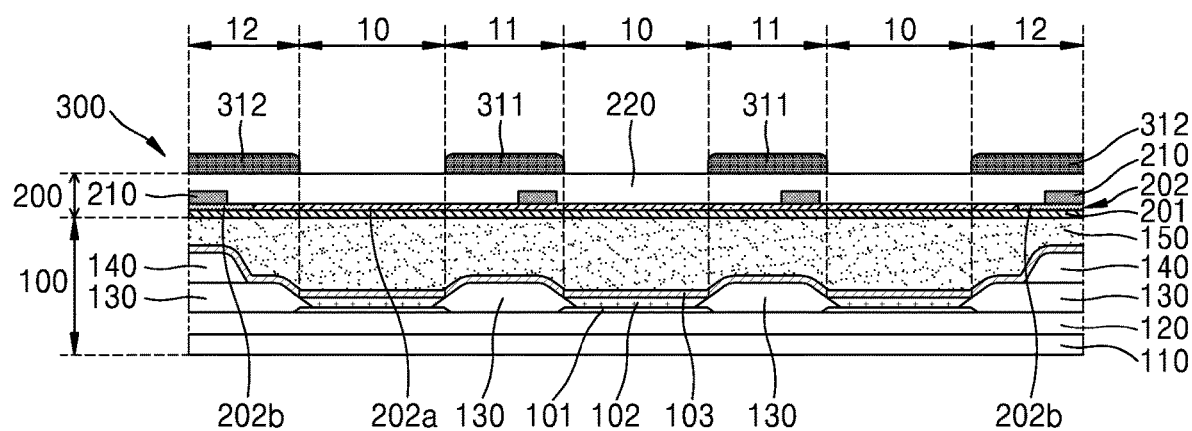

As illustrated in FIG. 2B, an organic layer 220 and a touch electrode 210 may be formed on the sensitivity compensation layer 202 to complete a touch screen layer 200, and then a first black matrix 311 covering the first non-emission region 11 and a second black matrix 312 covering the second non-emission region 12 may be formed thereon through a photoresist process or an inkjet process.

Figure 2C:
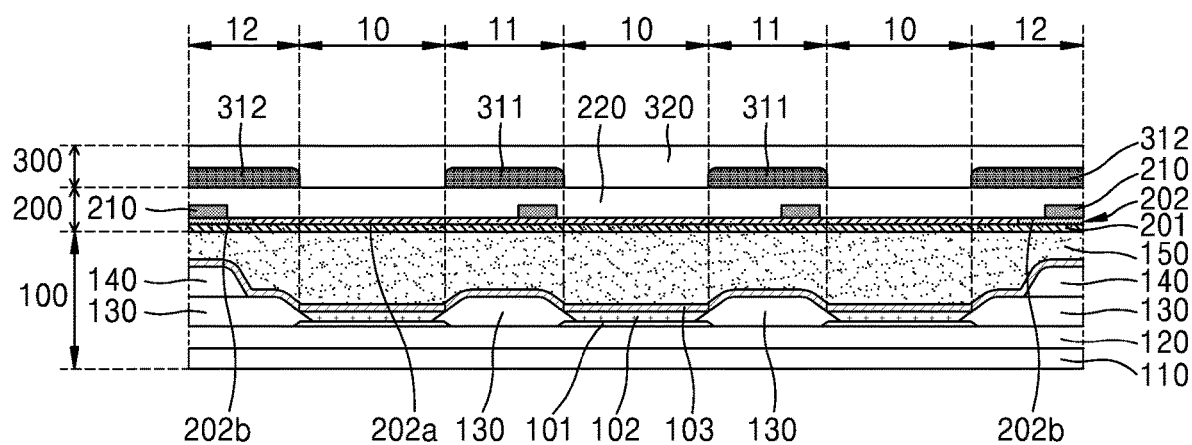
Figure 2D:
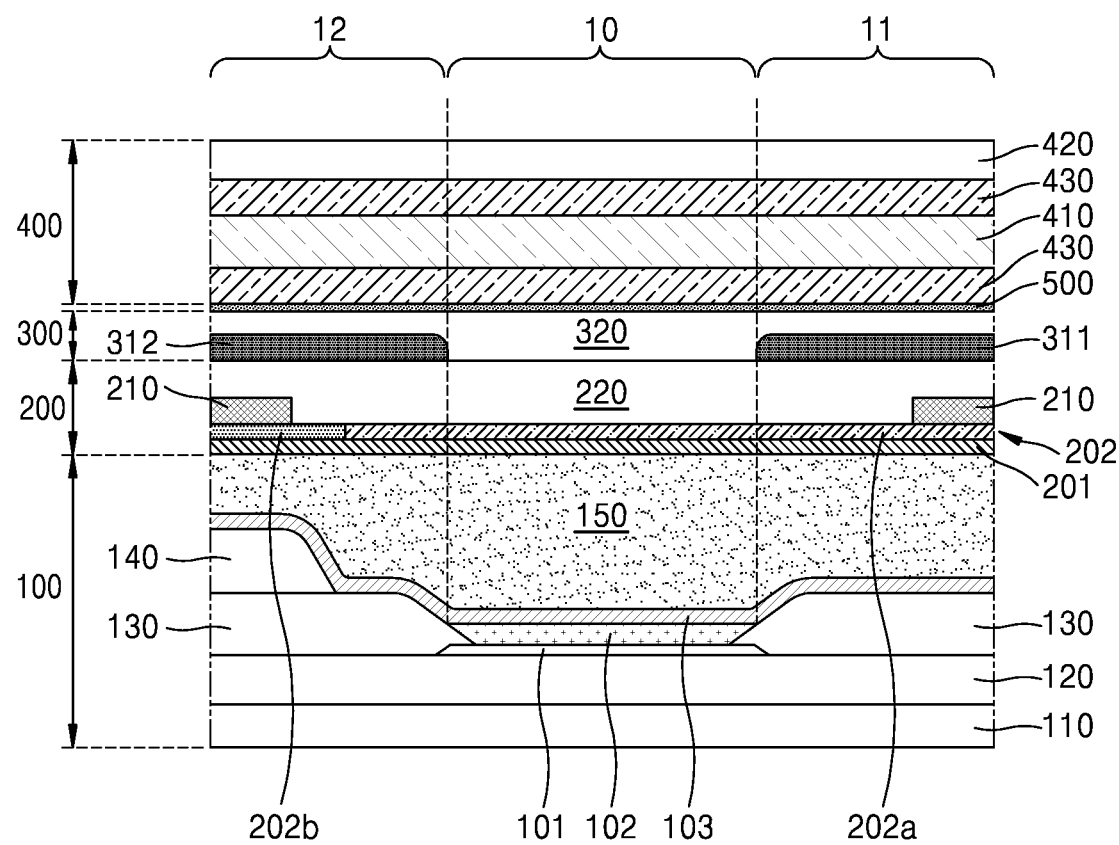

Subsequently, the resulting structure may be covered with a transparent organic layer 320 as illustrated in FIG. 2C, and a moisture blocking layer 500 and a window layer 400 may be formed thereon as illustrated in FIG. 2D.

As such, the sensitivity compensation layer 202 including the first and second dielectric constant portions 202a and 202b having different dielectric constants may be formed to correct the touch sensitivity difference in the first and second non-emission regions 11 and 12, thereby ensuring a stable touch operation and improving the performance and reliability of the product.

Figure 3:
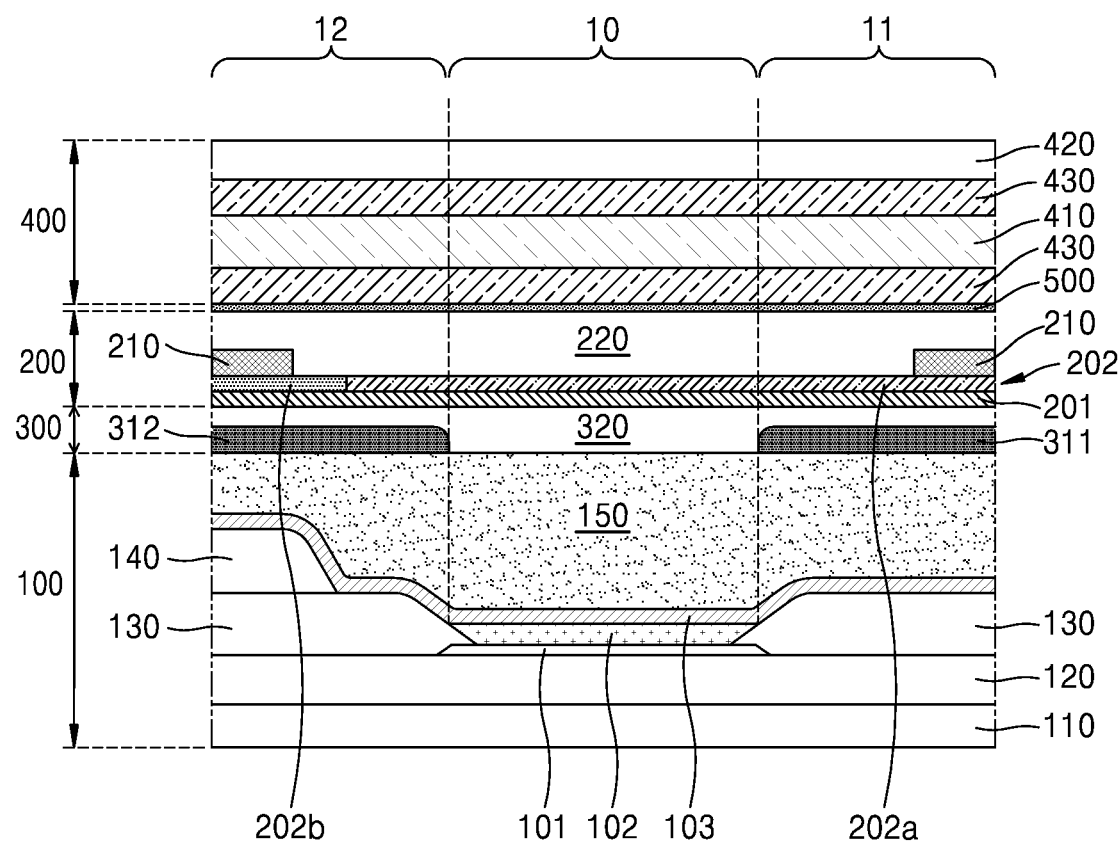
FIG. 3 is a cross-sectional view of an organic light emitting display apparatus according to some example embodiments.

Next, FIG. 3 is a cross-sectional view of an organic light emitting display apparatus according to some example embodiments.

According to some example embodiments, the dielectric constants of the first and second dielectric constant portions 202a and 202b in the sensitivity compensation layer 202 may be different from each other. However, in this case, the stack order of the light blocking layer 300 and the touch screen layer 200 may be changed in comparison with the structure of FIG. 1. Such a structure in which the light blocking layer 300 is arranged closer to the display layer 100 may improve a viewing angle, but may degrade a black vision because the touch electrode 210 of the touch screen layer 200 may be visible through the window layer 400.

That is, in the structure of FIG. 1, a black vision may be relatively improved because the first and second black matrixes 311 and 312 of the light blocking layer 300 may also entirely cover the touch electrode 210 of the touch screen layer 200 while covering the first and second non-emission regions 11 and 12, but a viewing angle may be relatively narrowed because the distance of the light blocking layer 300 from the emission layer 102 as a light source increases due to the intervention of the touch screen layer 200.

However, on the contrary, in the structure of FIG. 3, a viewing angle may be widened like a wide-angle lens because the distance of the light blocking layer 300 from the emission layer 102 as a light source decreases, but a black vision may be degraded because the touch screen layer 200 is visible through the window layer 400 as above.

Both structures may each have different characteristics and thus may be selectively adopted according the design of the display device; however, even in the structure of FIG. 3, the first and second dielectric constant portions 202a and 202b of the sensitivity compensation layer 202 in the touch screen layer 200 may be set to have different dielectric constants to correct the touch sensitivity.

Even in the case of a structure in which the light blocking layer 300 is located between the display layer 100 and the touch screen layer 200 as illustrated in FIG. 3, the sensitivity of the touch electrode 210 may improve as the dielectric constant of the sensitivity compensation layer 202 increases.

Thus, in the structure according to some example embodiments, the dielectric constant of the second dielectric constant portion 202b of the second non-emission region 12 having a relatively low touch sensitivity may be set to be higher than the dielectric constant of the first dielectric constant portion 202a of the first non-emission region 11. For example, the first dielectric constant portion 202a may be formed of a $SiN_x$ material and the second dielectric constant portion 202b may be formed of a $Y_2O_3$, $ZrO_2$, or $HfO_2$ material having a higher dielectric constant than the $SiN_x$ material, or the second dielectric constant portion 202b may be formed of a $ZrO_2$ material and the first dielectric constant portion 202a may be formed of a $Y_2O_3$ material having a lower dielectric constant than the $ZrO_2$ material.

In this way, likewise, the touch sensitivity difference caused by the spacer 140 may be compensated for by the sensitivity difference due to the dielectric constants of the first and second dielectric constant portions 202a and 202b, and thus, the touch sensitivity of the first and second non-emission regions 11 and 12 may be corrected to be uniform.

As such, the dielectric constants of the first and second dielectric constant portions 202a and 202b of the sensitivity compensation layer 202 may be set to be different from each other to correct the touch sensitivity difference between the first non-emission region 11 and the second non-emission region 12 to be uniform, thus ensuring a stable touch operation.

Figure 4:
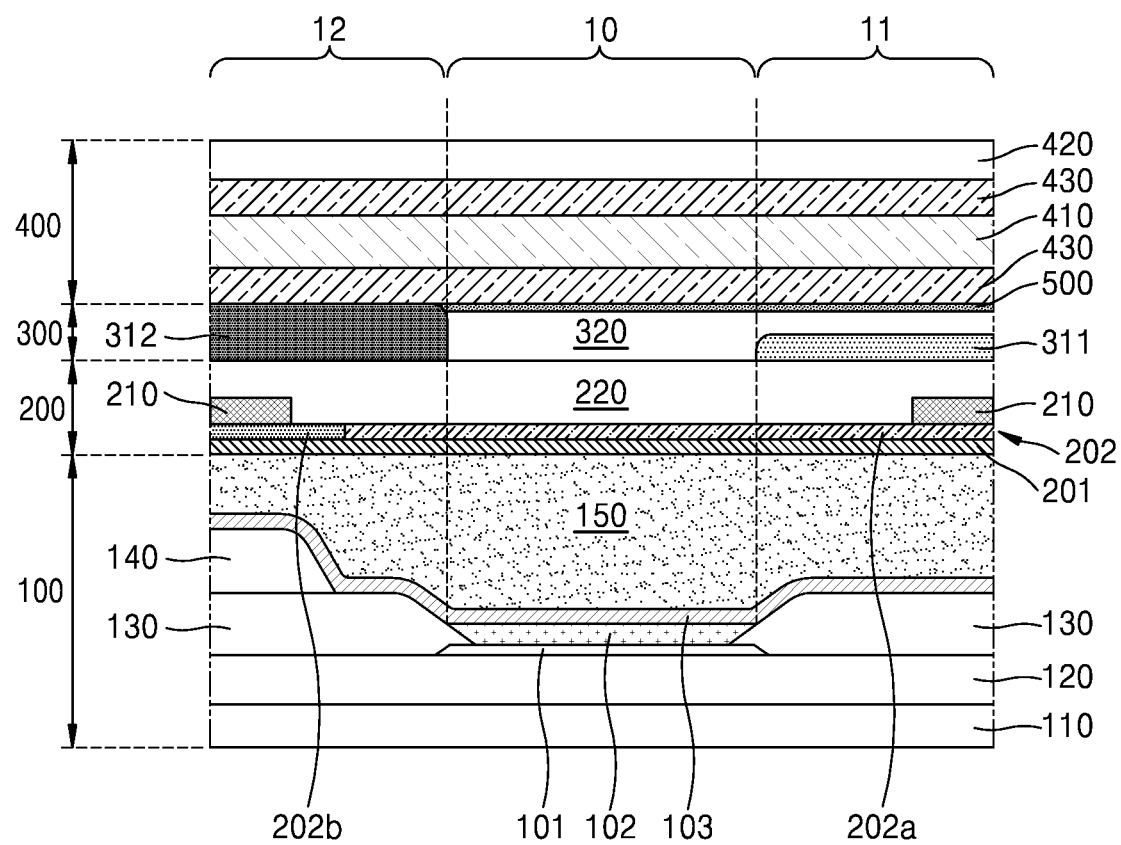
FIG. 4 is a cross-sectional view of an organic light emitting display apparatus according to some example embodiments.

Next, FIG. 4 is a cross-sectional view of an organic light emitting display apparatus according to some example embodiments. The structure illustrated in FIG. 4 may be the same as or similar to the structure of FIG. 1 and may also be the same as the structure of FIG. 1 in that the dielectric constant of the second dielectric constant portion 202b of the sensitivity compensation layer 202 is set to be higher than the dielectric constant of the first dielectric constant portion 202a.

However, in the structure illustrated in FIG. 4, the transparent organic layer 320 may not be formed over the entire region of the light blocking layer 300. That is, the transparent organic layer 320 may cover the first black matrix 311 but may not cover the second black matrix 312, and the second black matrix 312 and the transparent organic layer 320 may be formed to about the same thickness.

A structure according to some example embodiments may be manufactured as illustrated in FIGS. 5A to 5E.

Figure 5A:
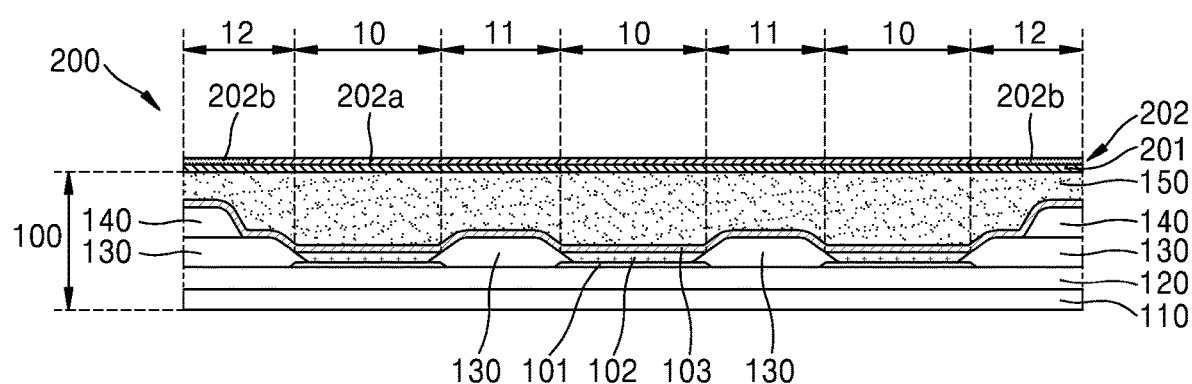
FIGS. 5A to 5E are cross-sectional views sequentially illustrating a process of manufacturing the organic light emitting display apparatus illustrated in FIG. 4.

First, as illustrated in FIG. 5A, a buffer layer 201 and a sensitivity compensation layer 202 of a touch screen layer 200 may be formed on a display layer 100. In this case, a first dielectric constant portion 202a and a second dielectric constant portion 202b may be formed in the same layer, and for example, the first dielectric constant portion 202a may be formed of a $SiN_x$ material and the second dielectric constant portion 202b may be formed of a $Y_2O_3$, $ZrO_2$, or $HfO_2$ material having a higher dielectric constant than the $SiN_x$ material. The first dielectric constant portion 202a may be arranged to correspond to an emission region 10 and a first non-emission region 11, and the second dielectric constant portion 202b may be arranged to correspond to a second non-emission region 12.

Figure 5B:
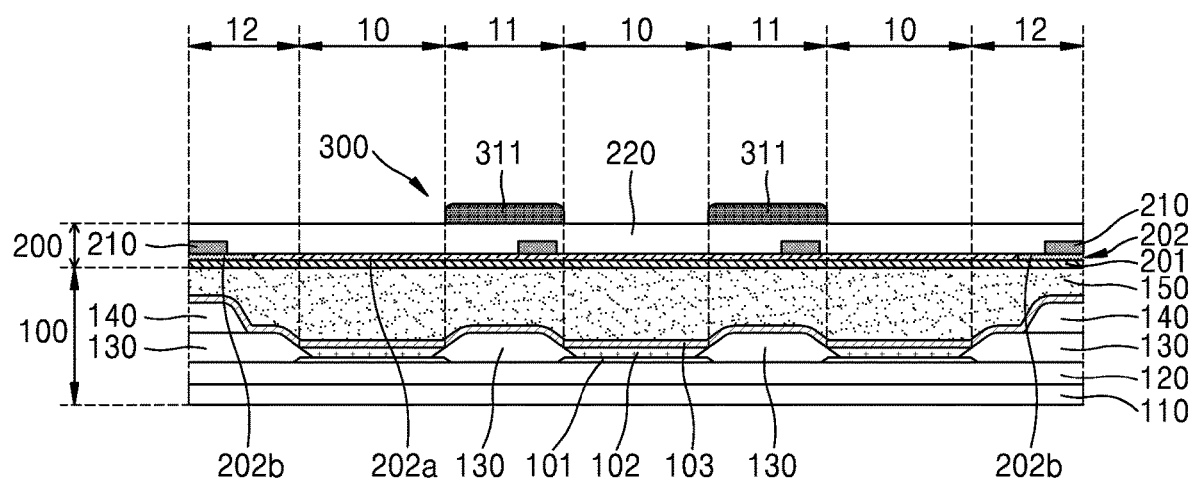

As illustrated in FIG. 5B, an organic layer 220 and a touch electrode 210 may be formed on the sensitivity compensation layer 202 to complete the touch screen layer 200, and then a first black matrix 311 may be formed in the first non-emission region 11 thereon through a photoresist process.

Figure 5C:
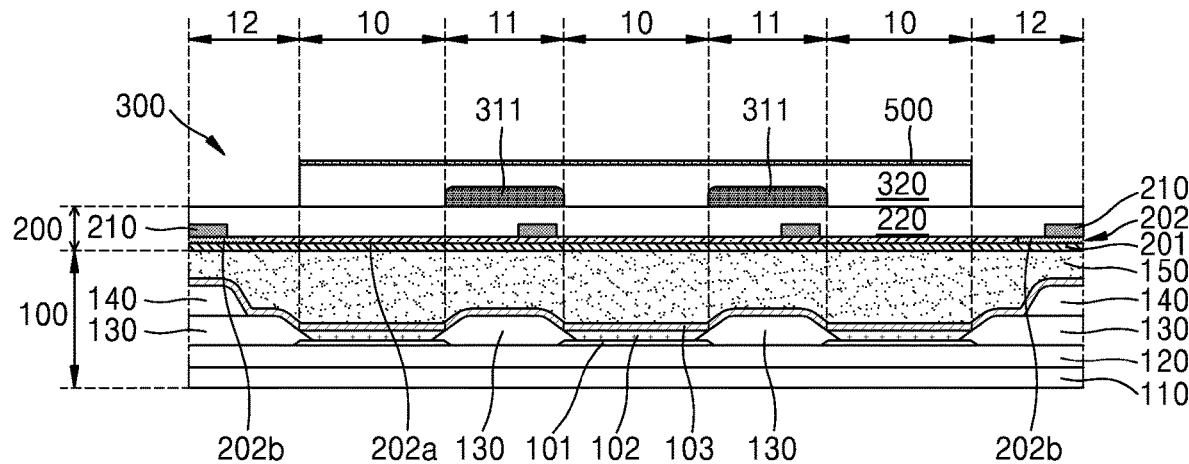

Subsequently, as illustrated in FIG. 5C, a transparent organic layer 320 and a moisture blocking layer 500 may be formed in the emission region 10 and the first non-emission region 11.

Figure 5D:
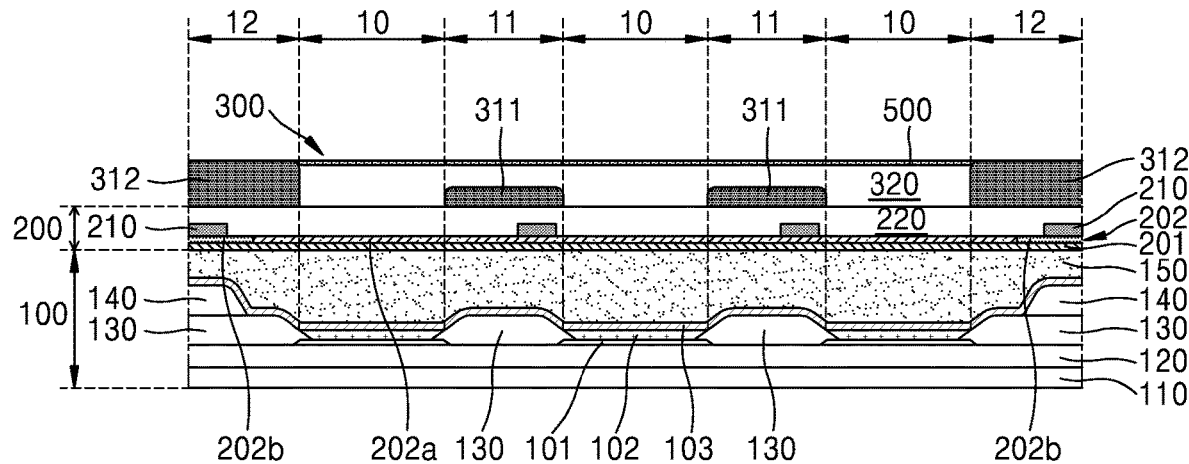

As illustrated in FIG. 5D, a second black matrix 312 may be formed in the second non-emission region 12 through an inkjet process.

Figure 5E:
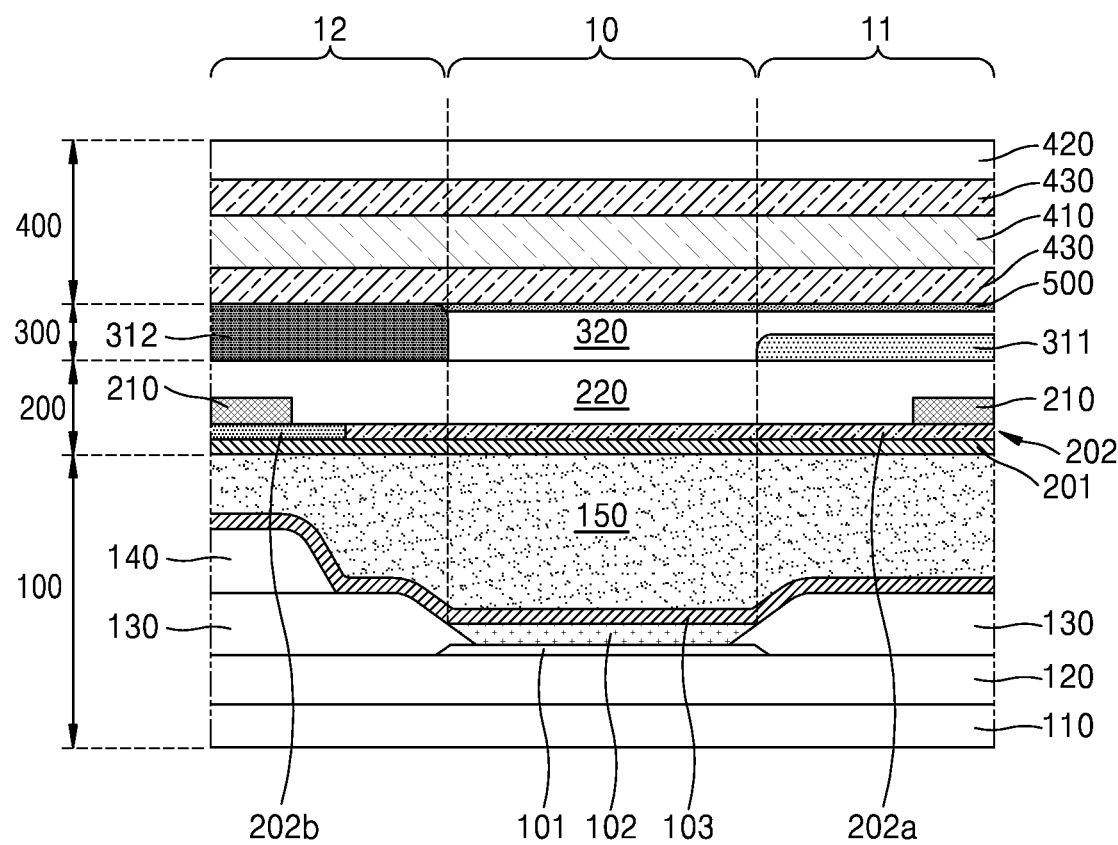

Subsequently, as illustrated in FIG. 5E, a window layer 400 may be formed thereon.

Thus, according to some example embodiments, the sensitivity compensation layer 202 including the first and second dielectric constant portions 202a and 202b having different dielectric constants may be formed to correct the touch sensitivity difference in the first and second non-emission regions 11 and 12, thereby implementing a structure ensuring a stable touch operation.

Figure 6:
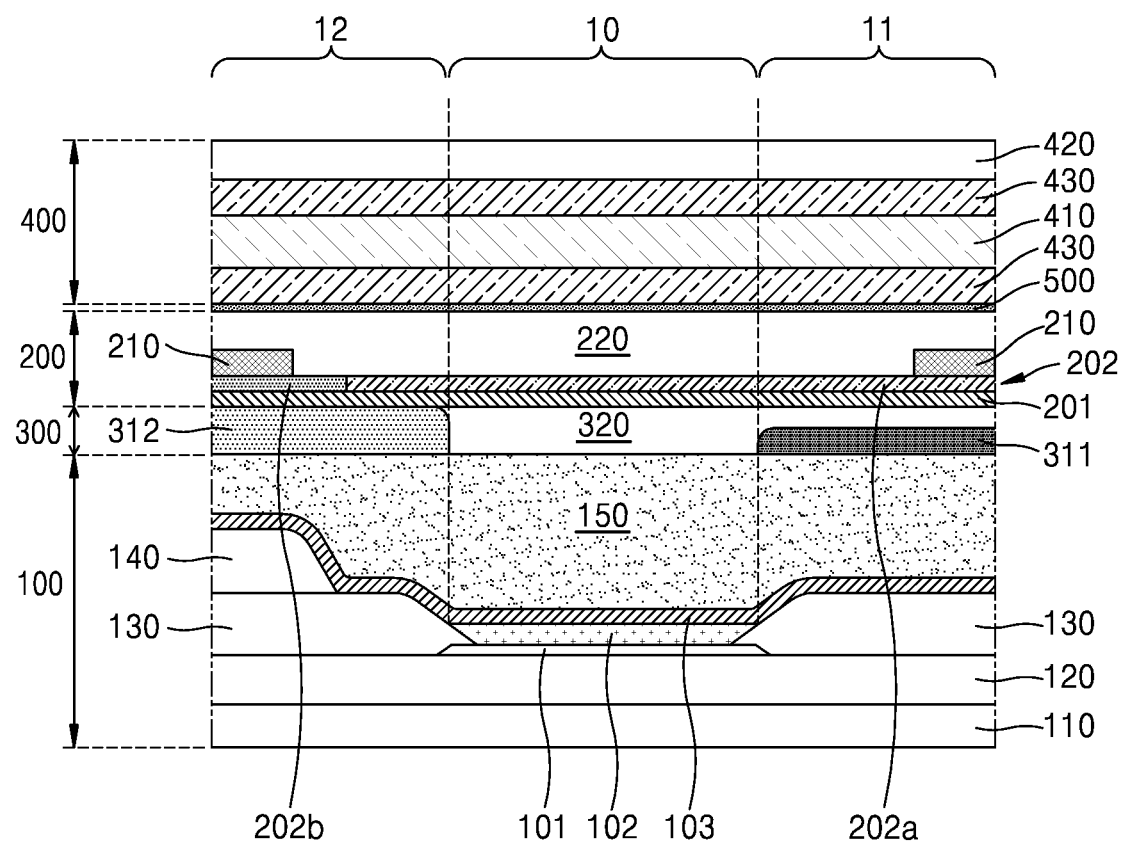
FIG. 6 is a cross-sectional view of an organic light emitting display apparatus according to some example embodiments.

FIG. 6 is a cross-sectional view of an organic light emitting display apparatus according to some example embodiments.

The structure illustrated in FIG. 6 may be the same as or similar to the structure of FIG. 3 and may also be the same as the structure of FIG. 3 in that the dielectric constant of the second dielectric constant portion 202b is set to be higher than the dielectric constant of the first dielectric constant portion 202a of the sensitivity compensation layer 202.

However, according to the structure illustrated in FIG. 6, the transparent organic layer 320 of the light blocking layer 300 may cover the first black matrix 311 but may not cover the second black matrix 312, and the second black matrix 312 and the transparent organic layer 320 may have about the same thickness. That is, as in FIG. 4, the transparent organic layer 320 may not have to be formed over the entire region of the light blocking layer 300.

Thus, according to some example embodiments, the sensitivity compensation layer 202 including the first and second dielectric constant portions 202a and 202b having different dielectric constants may be formed in the touch screen layer 200 to correct the touch sensitivity difference in the first and second non-emission regions 11 and 12, thereby implementing a structure ensuring a relatively stable touch operation (e.g., a touch input operation in which touch sensitivity is consistent between different areas or regions).

As described above, in the organic light emitting display apparatuses and the methods of manufacturing the organic light emitting display apparatus according to some example embodiments, because touch sensitivity differences in each region may be corrected by the differentiation of the dielectric constant of the light blocking layer, a touch input or sensing operation may be smoothly or more reliably performed and thus the performance and reliability of the product may be improved.

According to the organic light emitting display apparatuses and the methods of manufacturing the organic light emitting display according to some example embodiments, because the problem of the touch sensitivity difference in each region may be corrected by the differentiation of the dielectric constant of the sensitivity compensation layer, a touch operation may be smoothly performed and thus the performance and reliability of the product may be improved.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, and their equivalents.

What is claimed is:

1. An organic light emitting display apparatus comprising:
    a display layer including:
        an emission region;
        a first non-emission region having a pixel definition layer surrounding the emission region; and
        a second non-emission region having a spacer on the pixel definition layer; and
    a touch screen layer including a touch electrode at a position corresponding to the first non-emission region and the second non-emission region,
    wherein the touch screen layer further includes a sensitivity compensation layer including a first dielectric constant portion and a second dielectric constant portion of different dielectric constants arranged to respectively correspond to the first non-emission region and the second non-emission region.

2. The organic light emitting display apparatus of claim 1, wherein a dielectric constant of the second dielectric constant portion is greater than a dielectric constant of the first dielectric constant portion.

3. The organic light emitting display apparatus of claim 2, further comprising, on an opposite side of the touch screen layer with respect to a side facing the display layer, a light blocking layer including a first black matrix and a second black matrix respectively covering the first non-emission region and the second non-emission region.

4. The organic light emitting display apparatus of claim 3, wherein the light blocking layer further includes a transparent organic layer covering the emission region, and
the transparent organic layer also covers the first black matrix and the second black matrix.

5. The organic light emitting display apparatus of claim 3, wherein the light blocking layer further includes a transparent organic layer covering the emission region, and
the transparent organic layer covers the first black matrix and does not cover the second black matrix.

6. The organic light emitting display apparatus of claim 2, further comprising, between the display layer and the touch screen layer, a light blocking layer including a first black matrix and a second black matrix respectively covering the first non-emission region and the second non-emission region.

7. The organic light emitting display apparatus of claim 6, wherein the light blocking layer further includes a transparent organic layer covering the emission region, and
the transparent organic layer further covers the first black matrix and the second black matrix.

8. The organic light emitting display apparatus of claim 6, wherein the light blocking layer further includes a transparent organic layer covering the emission region, and
the transparent organic layer covers the first black matrix and does not cover the second black matrix.

9. The organic light emitting display apparatus of claim 1, wherein the display layer further includes an emission layer in the emission region, and a pixel electrode and an opposite electrode facing each other with the emission layer therebetween, and
the opposite electrode extends across the emission region, the first non-emission region, and the second non-emission region.

10. A method of manufacturing an organic light emitting display apparatus, the method comprising:
forming a display layer including:
an emission region;
a first non-emission region having a pixel definition layer surrounding the emission region; and
a second non-emission region having a spacer on the pixel definition layer; and
forming, on the display layer, a sensitivity compensation layer including a first dielectric constant portion and a second dielectric constant portion having different dielectric constants and arranged to respectively correspond to the first non-emission region and the second non-emission region, and a touch screen layer including a touch electrode at a position corresponding to the first non-emission region and the second non-emission region.

11. The method of claim 10, wherein a dielectric constant of the second dielectric constant portion is greater than a dielectric constant of the first dielectric constant portion.

12. The method of claim 11, further comprising forming, on an opposite side of the touch screen layer with respect to a side facing the display layer, a light blocking layer including a first black matrix and a second black matrix respectively covering the first non-emission region and the second non-emission region.

13. The method of claim 12, wherein the light blocking layer further includes a transparent organic layer covering the emission region, and
the transparent organic layer further covers the first black matrix and the second black matrix.

14. The method of claim 12, wherein the light blocking layer further includes a transparent organic layer covering the emission region, and
the transparent organic layer covers the first black matrix and does not cover the second black matrix.

15. The method of claim 11, further comprising forming, between the display layer and the touch screen layer, a light blocking layer including a first black matrix and a second black matrix respectively covering the first non-emission region and the second non-emission region.

16. The method of claim 15, wherein the light blocking layer further includes a transparent organic layer covering the emission region, the first black matrix, and the second black matrix.

17. The method of claim 15, wherein the light blocking layer further includes a transparent organic layer covering the emission region, and the first black matrix, and not covering the second black matrix.

18. The method of claim 10, wherein the display layer further includes an emission layer in the emission region, and a pixel electrode and an opposite electrode facing each other with the emission layer therebetween, and
the opposite electrode extends across the emission region, the first non-emission region, and the second non-emission region.

* * * * *